United States Patent [19]
Audet et al.

[11] Patent Number: 5,122,479
[45] Date of Patent: Jun. 16, 1992

[54] SEMICONDUCTOR DEVICE COMPRISING A SILICIDE LAYER, AND METHOD OF MAKING THE DEVICE

[75] Inventors: Sarah A. Audet, Bridgewater; Conor S. Rafferty, Basking Ridge; Kenneth T. Short; Alice E. White, both of New Providence, all of N.J.

[73] Assignee: AT&T Bell Laboratories, Murray Hill, N.J.

[21] Appl. No.: 683,891

[22] Filed: Apr. 11, 1991

[51] Int. Cl.$^5$ ............................................. H01L 21/44
[52] U.S. Cl. ..................................... 437/200; 437/24; 148/DIG. 3
[58] Field of Search ................ 437/200, 934, 46, 202; 148/DIG. 3, DIG.19

[56] References Cited

U.S. PATENT DOCUMENTS

| | | | |
|---|---|---|---|
| 4,522,845 | 6/1985 | Powell et al. | 437/200 |
| 4,683,645 | 8/1987 | Naguib et al. | 437/46 |
| 4,728,626 | 3/1988 | Tu | 437/200 |
| 4,877,748 | 10/1989 | Havemann | 437/160 |

OTHER PUBLICATIONS

Hewett, et al. "Ion Implantation and Ion Beam Processing of Materials" Proceedings of the Symposium, Ed: Hubler, et al. pp. 145-150 (1983), Abstract.
Hewett, et al. "Layered Structures and Inferface Kenetics" U.S. Jap. Seminar on Solid Phase Epitaxy and Inferface Kenetics, Ed: Furjkawa (1985), Abstract.
Madakson, et al., J. App. Physics vol. 62 (5) pp. 1688-1693 (1987), Abstract.
Delfino, et al., Phillips Journal of Research (1987) vol. 42 (5-6) pp. 593-607, Abstract.
Suzuki, et al. Applied Physics A (1990) vol. A50 (3) pp. 265-267 Abstract.
Radermacker, et al. J. App. Physics (1990) vol. 68 (6) pp. 3001-3008 Abstract.
"Novel Self-Aligned W/TiN/TiSi$_2$ Contact Structure For Very Shallow Junctions and Interconnections", by R. V. Joshi et al., *Applied Physics Letters*, 54 (17), Apr. 24, 1989, pp. 1672-1674.
"Stresses and Radiation Damage Ar$^+$ and Ti$^+$ Iion-Implanted Silicon", by P. Madakson et al., *Journal of Applied Physics, 62(5), Sep. 1, 1987, pp. 1688-1693*.
"Formation of Buried TiSi$_2$ Layers in Single Crystal Silicon by Ion Implantion", by P. Madakson et al., *Materials Research Society proceedings*, vol. 107, pp. 281-285.

*Primary Examiner*—Olik Chaudhuri
*Assistant Examiner*—Andrew Griffis
*Attorney, Agent, or Firm*—Eugene E. Pacher

[57] ABSTRACT

Disclosed is a method of making a Si-based semiconductor device comprising a contact region that comprises a thin (exemplarily less than 50 nm), substantially uniform silicide layer. The silicide preferably is CoSi$_2$ or TiSi$_2$. The method comprises implantation of the appropriate metal ions into a Si body, the dose and the body temperature selected such that substantially complete amorphization of the implant volume results. Subsequently, the Si body is subjected to an annealing treatment that results in recrystallization of the implant volume and formation of the silicide layer. The layer extends to the surface of the body and contains essentially all of the implanted metal ions. The invention can advantageously be used in conjunction with extremely shallow junctions, such as will be of interest in short (e.g., <0.5 μm) channel CMOS devices.

6 Claims, 5 Drawing Sheets

SEMICONDUCTOR DEVICE COMPRISING A SILICIDE LAYER, AND METHOD OF MAKING THE DEVICE

FIELD OF THE INVENTION

This invention pertains to the field of Si-based semiconductor devices, and to methods of making such devices.

BACKGROUND OF THE INVENTION

Among the persistent trends in the field of integrated semiconductor devices is the trend towards smaller and smaller devices. Device size is conventionally defined in terms of a "design rule", typically equivalent to the smallest planar device dimension. Current design rules in some commercially available Si-based integrated circuits (ICs) are below 1 $\mu$m (e.g., 0.9 $\mu$m), with further reduction being a virtual certainty. In the context of field effect transistors (e.g., CMOS technology), the smallest planar device dimension typically is the channel length.

Reduction of the channel length substantially below 1 $\mu$m (e.g., below about 0.5 $\mu$m) will require the fabrication of substantially more shallow source and drain junctions than are currently used, in order to avoid, inter alia, punch-through and short channel effects. Conventional contact metalization of such ultra-shallow (typically $\leq$100 nm) junctions can be expected to result in unacceptably high series resistance.

The use of $CoSi_2$ and $TiSi_2$ layers in contacts to junctions is known. These layers are conventionally fabricated by a technique that comprises deposition of a thin layer of the metal, followed by an anneal, or that comprises co-deposition of the metal and Si, again followed by an anneal. However, thus produced contacts generally exhibit a rough silicide/Si interface. Consequently, the junctions must typically extend at least about 50 nm beyond the average depth of the silicide layer, in order to avoid high leakage currents and silicide shorting to the substrate. Furthermore, substantially uniform $CoSi_2$ and $TiSi_2$ layers less than 50 nm thick are difficult to fabricate by the prior art technique.

In view of the need to have available a technique for contacting ultra-shallow junctions that is not subject to the shortcomings of the prior art, a technique for making relatively low resistance contacts with a substantially uniform metal/semiconductor interface that does not require a high temperature anneal (which can cause unwanted diffusion of dopant) and that is capable of reliably producing metal layers of less than 50 nm thickness, would be of importance. This application discloses such a technique.

R. V. Joshi et al. (*Applied Physics Letters*, Vol. 54(17), pp. 1672–1674) disclose a contact structure that comprises selectively deposited W on self-aligned TiN/-$TiSi_2$. The silicide layer was formed by deposition of Ti and reaction at 675° C.

U.S. Pat. No. 4,816,421 discloses a method (referred to as "mesotaxy") of making an epitaxial structure that comprises implantation of a metal species (e.g., Co) into a single crystal semiconductor (e.g., Si) body. Under appropriate conditions a buried stoichiometric silicide (e.g., $CoSi_2$) layer that is epitaxial with the matrix and of good crystalline quality can be formed. Mesotaxy can also produce single crystal $CoSi_2$ surface layers. However, these layers are invariably more than 50 nm thick. Furthermore, mesotaxy involves implantation at elevated temperature (e.g., 300°–400° C.) and a high temperature (e.g., 900°–1100° C.) anneal, undesirable features in sub-micron CMOS processing.

P. Madakson et al., *Journal of Applied Physics*, Vol. 62(5), pp. 1688–1693, report on studies of stress and radiation damage in <111> Si after ion implantation with 28 keV $Ar^+$ and 30 keV $Ti^+$, with doses ranging from $10^{12}$ to $10^{17}$ ions/cm$^2$. The effect on stress of annealing at 600° C. was also investigated. For doses above $10^{16}$ $Ti^+/cm^2$ and annealing at 600° C. for 2 hours, formation of a Ti-Si layer is reported. The layer reportedly contained both metastable and equilibrium phases, and $TiSi_2$ precipitates remained in the substrate. See also P. Madakson et al., *Material Research Society Symposium Proceedings*, Vol. 107, pp. 281–285, which discloses similar results.

GLOSSARY AND DEFINITIONS

The "implant volume" herein is the volume of the substrate in which, immediately after completion of the implantation, 90% of the implanted ions reside.

A portion of a single crystal Si body herein is "substantially amorphized" if substantially no indication of crystallinity is detectable by conventional X-ray diffraction analysis of the portion.

A surface herein "substantially has <100> orientation" if the orientation of the surface is within 5° of a <100> crystal plane.

SUMMARY OF THE INVENTION

Figure 1:
FIG. 1 is an electron micrograph of a $CoSi_2$/Si combination produced according to the invention.

In a broad aspect the invention is a method of making an article (e.g., an integrated circuit chip) that comprises a single crystal Si body with a contact region thereon, the contact region comprising a substantially uniform metal silicide layer of thickness less than about 50 nm, the silicide layer formed on a doped region of the Si body (said region to be referred to as a "junction").

More specifically, in one embodiment the inventive method comprises providing a Si body having a (preferably substantially <100>-oriented) major surface, forming the contact region on the major surface, and carrying out one or more further steps (e.g., providing metal interconnects, dicing, encapsulating, packaging) towards completion of the article. Significantly, the contact-region-forming step comprises implanting metal ions (typically $Co^+$ or $Ti^+$) into the portion of the Si body that is associated with the contact region, with the ion dose and the body temperature selected such that substantially complete amorphization of the implant volume results. The implantation energy is selected such that the implant volume extends to the major surface. The contact-forming step further comprises annealing the Si body at a temperature and for a time selected such that recrystallization of the implant volume and formation of a substantially uniform metal silicide layer results, with the layer extending to the major surface and containing essentially all of the metal ions that were implanted into the body. Furthermore, the dose is selected such that the thickness of the silicide layer is less than 50 nm.

The minimum (energy-dependent) ion dose that results in amorphization of the implant volume is known in many cases and, in any case, can easily be determined with at most a minor amount of experimentation. In general this dose will be above about $5 \times 10^{14} cm^{-2}$ for the ions and energies of interest herein. During implantation the temperature of the Si body advantageously will be maintained below the temperature at which dynamic recrystallization of Si occurs. Typically the body temperature will be below 200° C., preferably below 100° C. The ion energy typically will be low, below 100 keV, even below 50 keV, selected such that the implanted ions are concentrated near the surface of the body. The anneal temperature typically will be below about 900° C. (for $CoSi_2$ preferably below about 800° C.), although higher temperatures are not excluded. For instance, a rapid thermal anneal (RTA) at a higher temperature is expected to yield acceptable results, assuming that the anneal time is sufficiently short (exemplarily less than 600, possibly even less than 60 seconds). Providing a cap layer (e.g., $SiO_2$) over the implanted region also may allow use of a higher anneal temperature. In general, acceptable combinations of temperature and anneal time will be those that do not result in substantial diffusion of one or more of the constituents.

Although the inventive method is likely to have broader applicability, we currently believe that it will be most useful for Co and Ti silicide layers, with Co being currently preferred. $CoSi_2$ interacts relatively little with dopants or with $SiO_2$, and is relatively resistant to most conventional plasma processes used in semiconductor processing. Furthermore lateral silicidation essentially does not take place in $CoSi_2$ formation, making possible formation of a well-defined patterned $CoSi_2$ layer by implantation through a conventional mask (e.g., photoresist or $SiO_2$).

Articles according to the invention comprise a Si body having a major surface (typically a surface substantially having a <100> orientation), with $CoSi_2$ or $TiSi_2$ layer overlying at least a portion of the body, said portion containing a junction, with the silicide layer making electrical contact with the junction. The silicide layer is less than 50 nm thick, with a well-defined interface with the doped Si of the body. Exemplarily, articles according to the invention are integrated circuit chips (e.g., CMOS chips) with minimum planar feature size (e.g., channel length) less than about 0.5 $\mu m$.

DETAILED DESCRIPTION OF SOME PREFERRED EMBODIMENTS

FIG. 1 is a cross-sectional transmission electron micrograph of a Si body with a $CoSi_2$ surface layer thereon, the combination produced according to the invention. In particular, into a conventional (100) Si wafer were implanted $7 \times 10^{16} Co^+/cm^2$ at 40 keV, with the wafer not intentionally heated. Wafer temperature did not exceed 50° C. The implantation was performed in a vacuum chamber attached to a commercially available (Eaton NOVA) implanter with a conventional Freeman-type ion source. The resulting Co distribution was roughly Gaussian, with the implant volume extending from the wafer surface to an approximate depth of about 80 nm. The material in the implant volume was substantially amorphized.

The implanted wafer was annealed under vacuum (pressure $<10^{-7}$ Torr) in a conventional laboratory furnace at 600° C. for 1 hour. The anneal resulted in coalescence of the implanted Co into the desired $CoSi_2$ layer, and also resulted in re-crystallization of the Si by solid phase epitaxy. The thus produced $CoSi_2$ extended to the wafer surface. The layer was polycrystalline, the grains having an average diameter of about 0.5 $\mu m$. The layer was uniformly thick with a smooth interface, except at the grain boundaries. The layer thickness was approximately 30 nm, with an approximately 8 nm variation at the grain boundaries. The layer was continuous, with a coverage of close to 100%. Its is resistivity was about 18 $\mu \Omega \cdot cm$.

Subsequent annealing of some of the thus produced $CoSi_2/Si$ samples at 800° C. for 30 minutes resulted in considerable deterioration of the $CoSi_2$ layer, including loss of layer continuity. On the other hand, a rapid thermal anneal (RTA) at 800° C. for 20 seconds did not cause measurable deterioration of the $CoSi_2$ layer. A 20 second RTA at 900° C. however did result in some grain separation and resistivity increase. These results indicate that bodies produced according to the invention can be subjected to technologically significant heat treatment subsequent to silicide layer formation, but that not all heat treatment conditions will be acceptable. Routine experimentation will be able to determine acceptable conditions.

A series of implantation runs at constant energy (40 keV) but varying $Co^+$ dose (6, 8 and $9 \times 10^{16} cm^{-2}$) confirmed that the thickness of the resulting $CoSi_2$ layer depends substantially linearly on the dose. Implantation ($7 \times 10^{16} cm^{-2}$) at elevated temperature (350° C.) and higher energies (60 and 80 keV) did not produce substantially complete amorphization of the implant volume, and yielded buried layers after annealing at 600° C. and 750° C., both for one hour.

Figure 2:
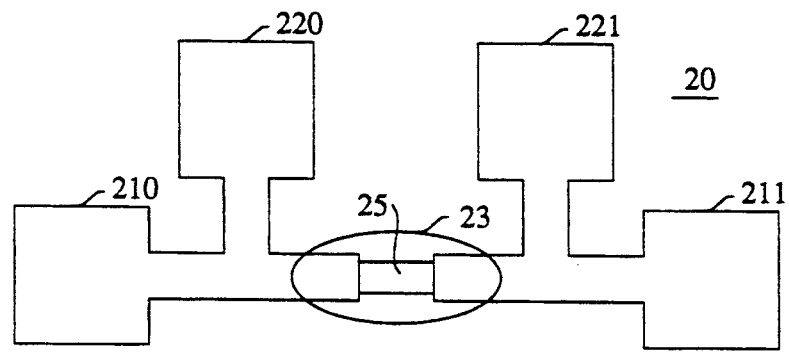
FIG. 2 schematically shows the conductor pattern used to determine the resistivity of silicide layers formed according to the invention.
Figure 3:
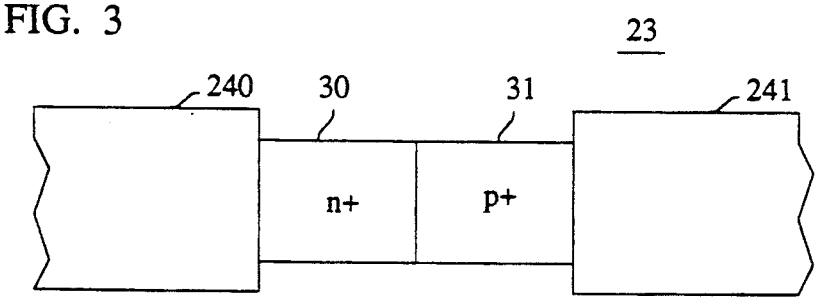
FIGS. 3 and 4 schematically show further detail of said conductor pattern.
Figure 4:
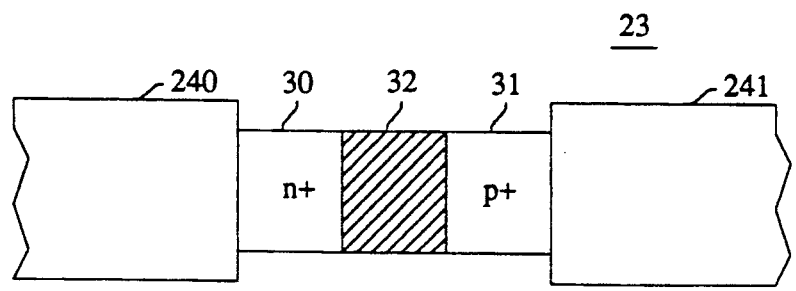

In a further embodiment of the inventive method, the Si body was the Si layer of a SOS (silicon-on-sapphire) substrate. On the surface of the Si layer were formed structures as shown schematically in FIGS. 2-4. FIG. 2 shows in plan view a conventional 4-point probe pattern 20 that comprises current contacts (210, 211) and voltage contacts (220, 221), all electrically connected to an elongate composite conductor (240, 25, 241). Constriction 25 comprises an $n^+$-doped region and a $p^+$-doped region. This is shown in more detail in FIGS. 3 and 4, which show alternative versions of region 23. Constriction 25 is about 20 $\mu m$ long, with widths in the range 0.5-6 $\mu m$. The doped regions 30 and 31 were formed by sequential ion implantation (170 keV, $6 \times 10^{14} cm^{-2}$ $As^+$; 80 keV, $4 \times 10^{15} cm^{-2} BF^+$) with the aid of a conventional photoresist mask. In half of the structures, $Co^+$ was implanted (40 keV, $7 \times 10^{16} cm^{-2}$) into region 32, followed by a 600° C., 1 hour anneal to form a $CoSi_2$ strap overlying a portion each of 30 and 31.

Figure 5:
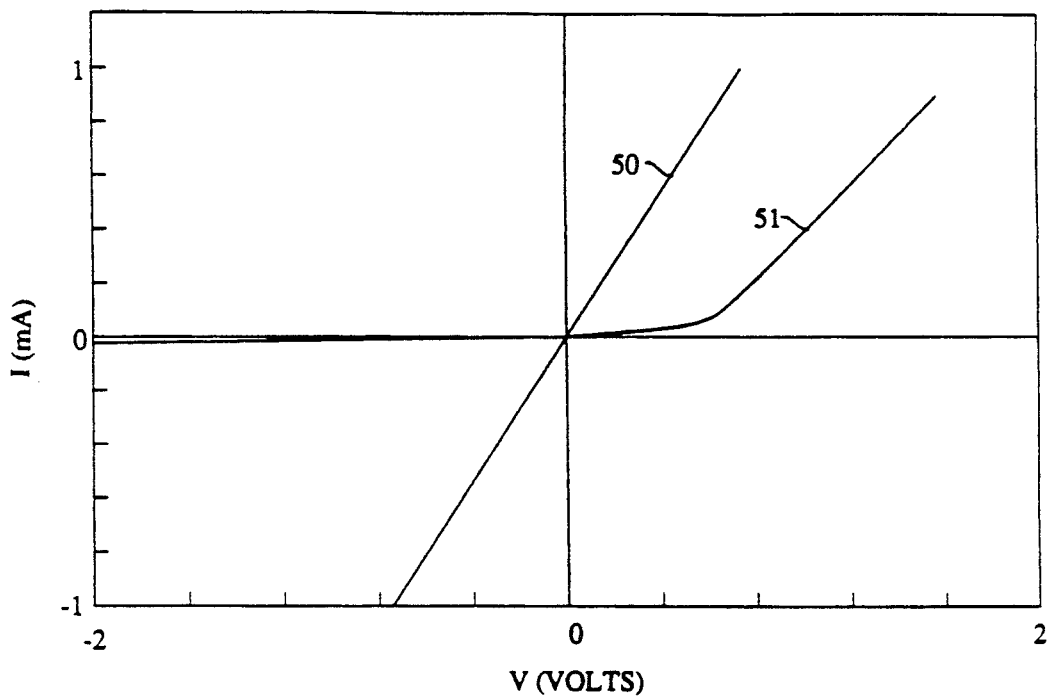
FIG. 5 gives results of electrical measurements carried out with the aid of said conductor pattern.

The exemplary results of electrical measurements on thus produced structures 20 are shown in FIG. 5, wherein curve 50 pertains to a structure with a $CoSi_2$ strap, and 51 to a structure without such a strap. The measurements clearly establish that a $CoSi_2$ layer produced according to the invention can be used to form a low resistance contact to n+-and p+-type Si regions.

A TiSi₂ layer according to the invention was produced substantially as described above, except that the implanted dose was $8 \times 10^{16} cm^{-2}$. Anneal at 800° C. for 30 minutes resulted in a substantially uniform TiSi₂ layer, with resistivity of about 14 $\mu\Omega\cdot cm$. Heating at 900° C. for 30 minutes resulted in some break-up of the layer.

Figure 6:
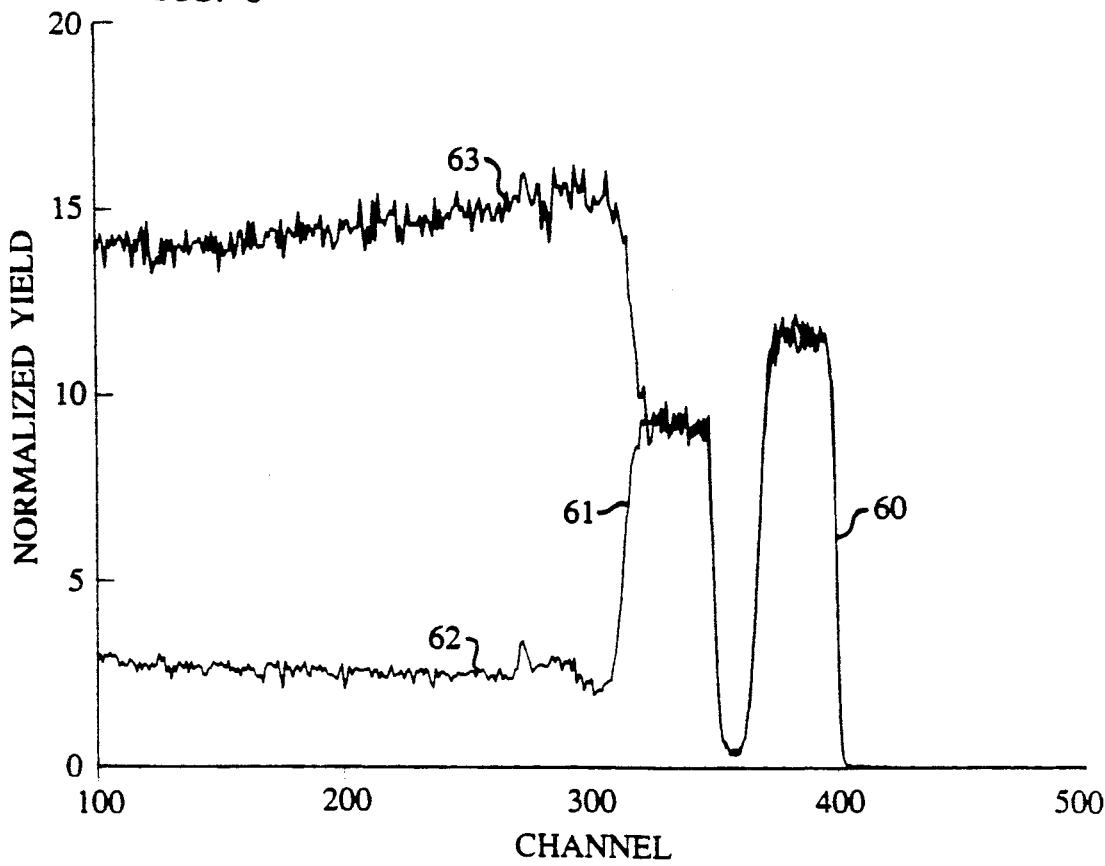
FIG. 6 shows RBS (Rutherford backscattering spectroscopy) data for a $TiSi_2$ film on Si, produced according to the invention.
Figure 7:
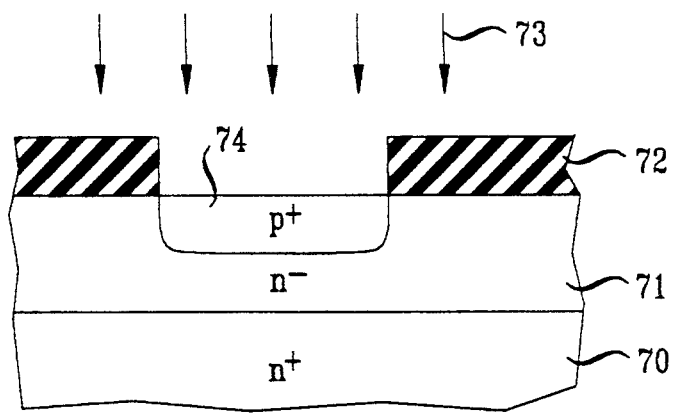
FIGS. 7–10 schematically depict relevant steps of an exemplary embodiment of the inventive method.
Figure 8:
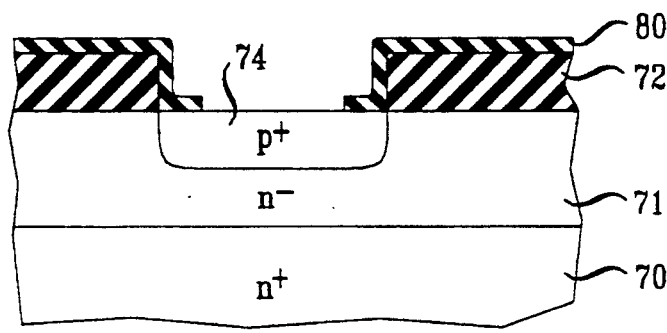
Figure 9:
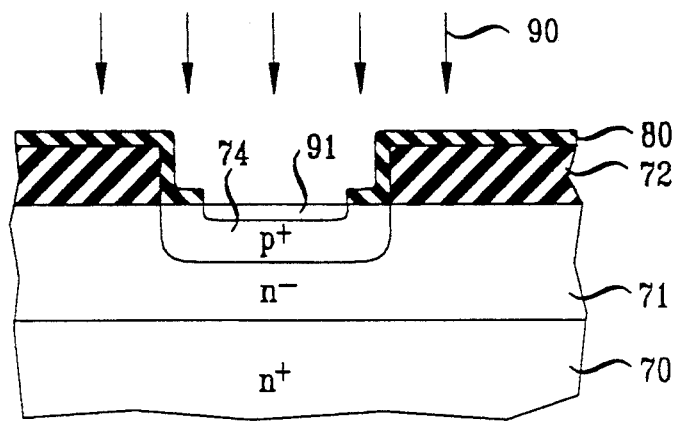
Figure 10:
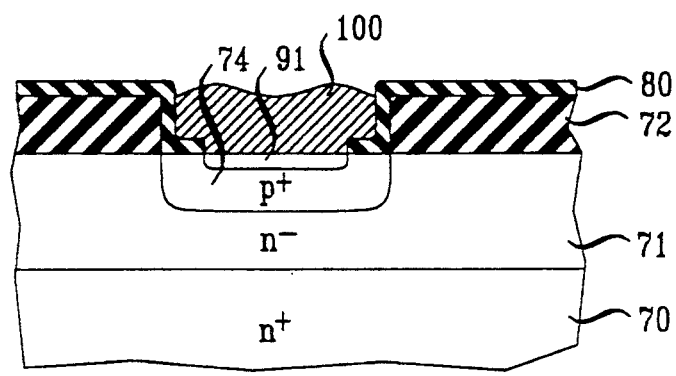

FIG. 6 shows the RBS spectrum (2MeV He, beam diameter 1 mm, detection at glancing geometry to enhance depth resolution) obtained from the above described TiSi₂/Si combination. Those skilled in the art do not require detailed explanation of the data. Briefly, peak 60 is associated with the Ti in the TiSi₂ layer, and peak 61 with the Si. Curves 62 and 63 are obtained in the channeled and random direction, respectively. The data indicates that the layer material is polycrystalline, that the TiSi₂ layer is of substantially uniform thickness, that essentially all of the implanted Ti is in the layer, and that only a very minor amount of implantation damage remained after the anneal (1 hour at 600° C.).

Those skilled in the art will appreciate that the formation of a silicide layer according to the invention generally will be part of a multistep semiconductor device fabrication process whose other steps can be conventional. Exemplarily, both dopant implantation into the Si body and metal (e.g., Co or Ti) implantation into the doped region can utilize the same patterned processing layer, e.g., a SiO₂ layer with "windows" therein, the windows defining the implantation regions. FIGS. 7-10 schematically depict relevant steps of an exemplary embodiment of the inventive process. A silicon body comprises n+ region 70, with epitaxial n⁻ layer 71 thereon. Patterned SiO₂ layer 72 defines an implantation region into which p-dopant 73 (exemplarily BF+) is implanted to form p+ region 74, in a p-n junction. After a conventional activation anneal a further SiO₂ layer 80 is deposited and patterned, and metal ions 90 (exemplarily $7 \times 10^{16} cm^{-2}$ Co+ at 40 keV) implanted into contact region 91. After a silicide formation anneal (exemplarily 1 hour at 600° C. in vacuum) that results in formation of a silicide layer according to the invention, a metal layer (exemplarily Al) is deposited and patterned in conventional manner, providing metal contact 100.

We claim:

1. A method of manufacturing an article comprising a single crystal Si body with a metal silicide-containing contact region on a major surface of the body, the method comprising
   a) providing the Si body;
   b) forming the contact region including forming a metal silicide layer;
   c) carrying out one or more further steps towards completion of the article;
   CHARACTERIZED IN THAT
   d) step b) comprises
   i) implanting metal ions into the portion of the Si body that is associated with the contact region, associated with the implantation being an energy, a dose and an implant volume, the dose and the Si body temperature selected such that substantially complete amorphization of the implant volume results, the energy selected such that the implant volume extends to the major surface, the metal ions selected from the group consisting of Co ions and Ti ions; and
   ii) annealing the Si body at a temperature and for a time selected to result in recrystallization of the implant volume and formation of a substantially uniform metal silicide layer that extends to the major surface and contains essentially all of said metal ions implanted into the body; wherein
   iii) the dose is selected such that the thickness of said metal silicide layer is less than 50 nm.

2. Method according to claim 1, wherein the major surface substantially has <100> orientation.

3. Method of claim 2, wherein the Si body during step d)i) is maintained at a temperature less than 100° C., and the ion dose is greater than $10^{16}$ ions/cm².

4. Method of claim 1, wherein step d)ii) comprises annealing the Si body at a temperature of 800° C. or less.

5. Method of claim 1, wherein step d)ii) comprises heating the Si body to a temperature above 800° C., for a time less than 60 seconds.

6. Method of claim 1, wherein the ions are Co ions.

* * * * *